United States Patent
Liu et al.

(10) Patent No.: US 10,256,180 B2
(45) Date of Patent: Apr. 9, 2019

(54) PACKAGE STRUCTURE AND MANUFACTURING METHOD OF PACKAGE STRUCTURE

(71) Applicant: IBIS Innotech Inc., Taichung (TW)

(72) Inventors: Wen-Chun Liu, Taichung (TW); Wei-Jen Lai, Taichung (TW)

(73) Assignee: IBIS Innotech Inc., Taichung (TW)

( * ) Notice: Subject to any disclaimer, the term of this patent is extended or adjusted under 35 U.S.C. 154(b) by 21 days.

(21) Appl. No.: 15/461,499

(22) Filed: Mar. 17, 2017

(65) Prior Publication Data

US 2017/0194241 A1 Jul. 6, 2017

Related U.S. Application Data

(63) Continuation-in-part of application No. 15/232,808, filed on Aug. 10, 2016, now Pat. No. 9,801,282.
(Continued)

(30) Foreign Application Priority Data

Jun. 24, 2014 (TW) .............................. 103121829 A
Jan. 11, 2017 (TW) .............................. 106100819 A

(51) Int. Cl.
*H01L 23/498* (2006.01)
*H01L 23/31* (2006.01)
(Continued)

(52) U.S. Cl.
CPC ...... *H01L 23/49838* (2013.01); *H01L 21/486* (2013.01); *H01L 21/4853* (2013.01);
(Continued)

(58) Field of Classification Search
USPC ........................................................ 361/767
See application file for complete search history.

(56) References Cited

U.S. PATENT DOCUMENTS 6,727,576 B2  4/2004  Hedler et al.
9,000,584 B2  4/2015  Lin et al.
(Continued)

FOREIGN PATENT DOCUMENTS

CN  101589468  11/2009
CN  102693955  9/2012
(Continued)

OTHER PUBLICATIONS

Korczynski, "Wafer-level packaging of ICs for mobile systems of the future," Semiconductor Manufacturing & Designs Community, May 2014, pp. 1-5.
(Continued)

*Primary Examiner* — Andargie M Aychillhum
(74) *Attorney, Agent, or Firm* — JCIPRNET

(57) ABSTRACT

A package structure includes a substrate, an insulator, a plurality of pads and a patterned circuit layer. The substrate includes a plurality of through holes. The insulator covers the substrate and is filled in the through hole. The conductive vias are located in the through holes and penetrate the insulator filled in the through holes. The pads are disposed on an upper surface and a lower surface of the insulator and electrically connected to the conductive vias. A bottom surface of each pad is lower than the top surface of the insulator. The patterned circuit layer is disposed on the top surface of the insulator and connected to the conductive vias and the pads. A bottom surface of the patterned circuit layer is lower than the top surface of the insulator.

21 Claims, 11 Drawing Sheets

Related U.S. Application Data which is a continuation-in-part of application No. 14/663,447, filed on Mar. 19, 2015, now Pat. No. 9,451,694.

(51) Int. Cl.

| | | |
|---|---|---|
| *H01L 23/29* | (2006.01) | |
| *H01L 23/48* | (2006.01) | |
| *H01L 25/065* | (2006.01) | |
| *H01L 21/48* | (2006.01) | |
| *H01L 23/00* | (2006.01) | |
| *H05K 1/02* | (2006.01) | |
| *H05K 1/03* | (2006.01) | |
| *H05K 1/11* | (2006.01) | |
| *H05K 1/18* | (2006.01) | |
| *H05K 3/18* | (2006.01) | |
| *H05K 3/40* | (2006.01) | |
| *H05K 3/00* | (2006.01) | |
| *H05K 3/10* | (2006.01) | |
| *H05K 3/46* | (2006.01) | |

(52) U.S. Cl.
CPC ........ *H01L 23/293* (2013.01); *H01L 23/3128* (2013.01); *H01L 23/481* (2013.01); *H01L 23/49827* (2013.01); *H01L 23/49894* (2013.01); *H01L 24/17* (2013.01); *H01L 25/0652* (2013.01); *H01L 25/0655* (2013.01); *H01L 25/0657* (2013.01); *H05K 1/0218* (2013.01); *H05K 1/0353* (2013.01); *H05K 1/0373* (2013.01); *H05K 1/115* (2013.01); *H05K 1/181* (2013.01); *H05K 3/188* (2013.01); *H05K 3/4007* (2013.01); *H01L 2224/16113* (2013.01); *H01L 2224/16227* (2013.01); *H01L 2225/06548* (2013.01); *H01L 2225/06586* (2013.01); *H01L 2924/1579* (2013.01); *H01L 2924/15311* (2013.01); *H01L 2924/186* (2013.01); *H01L 2924/19105* (2013.01); *H05K 1/113* (2013.01); *H05K 3/0014* (2013.01); *H05K 3/105* (2013.01); *H05K 3/4697* (2013.01); *H05K 2201/0236* (2013.01); *H05K 2201/0376* (2013.01); *H05K 2201/0919* (2013.01); *H05K 2201/09063* (2013.01); *H05K 2201/09118* (2013.01); *H05K 2201/10151* (2013.01); *H05K 2201/10515* (2013.01); *H05K 2201/10674* (2013.01)

(56) References Cited

U.S. PATENT DOCUMENTS

| | | | |
|---|---|---|---|
| 2010/0044853 A1* | 2/2010 | Dekker | B81C 1/00087 |
| | | | 257/692 |
| 2010/0127372 A1 | 5/2010 | Holland | |
| 2012/0139090 A1 | 6/2012 | Kim et al. | |
| 2013/0328211 A1* | 12/2013 | Shimizu | H01L 23/481 |
| | | | 257/774 |
| 2016/0233152 A1 | 8/2016 | Liu | |

FOREIGN PATENT DOCUMENTS

| | | |
|---|---|---|
| TW | 432644 | 5/2001 |
| TW | I563608 | 12/2016 |

OTHER PUBLICATIONS

"Office Action of Taiwan Counterpart Application", dated Nov. 27, 2018, p. 1-p. 10.

* cited by examiner

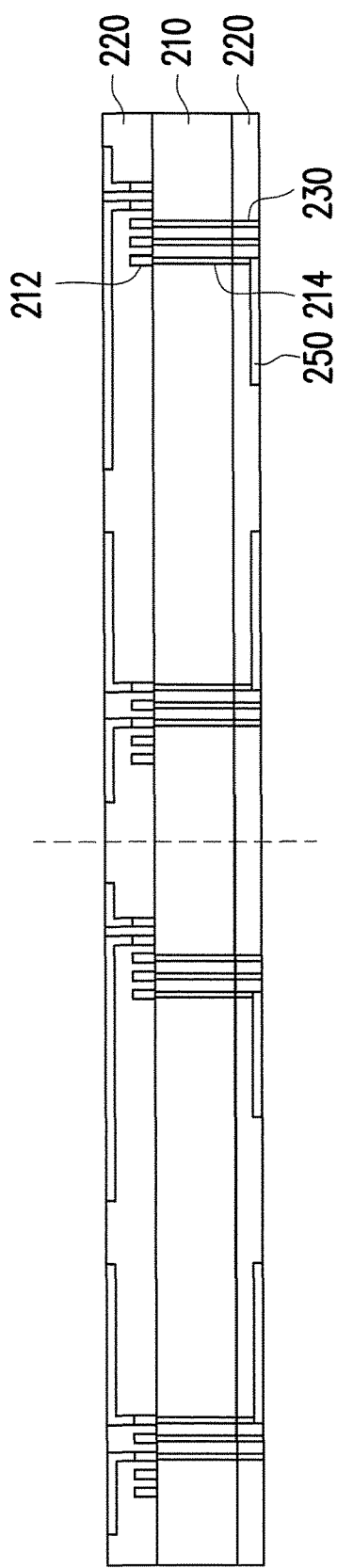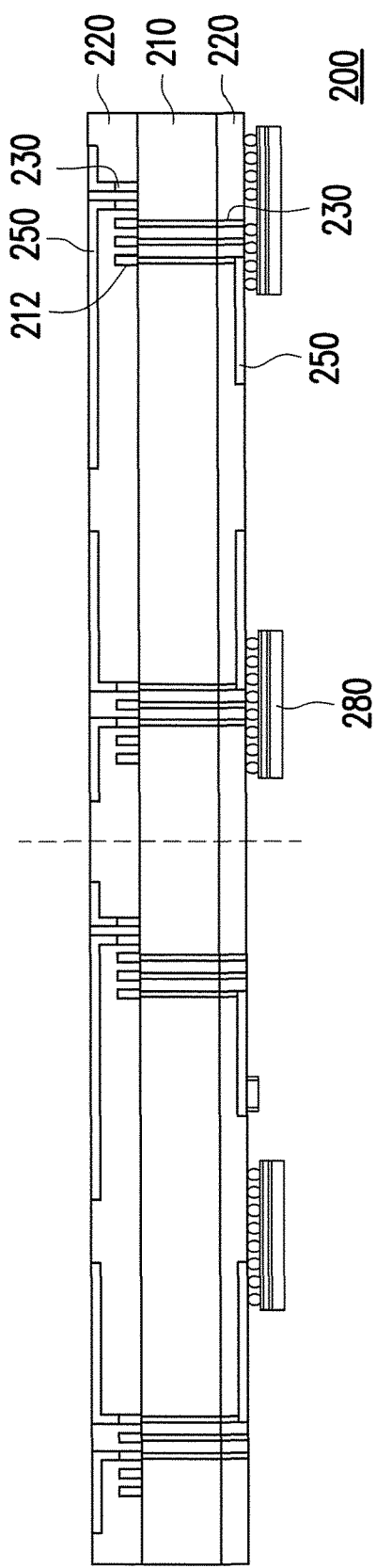

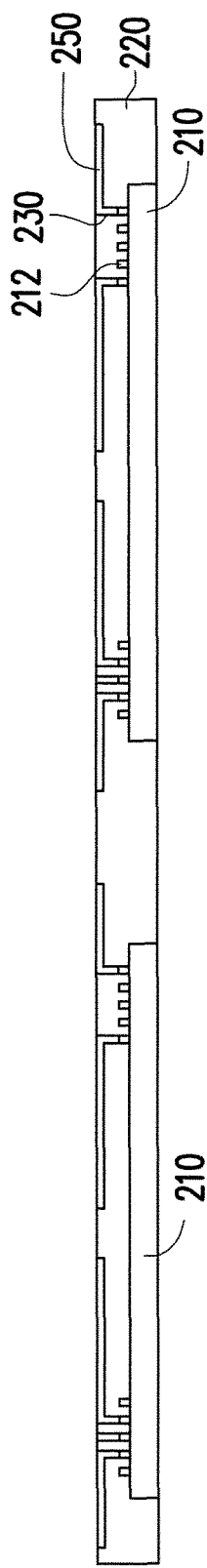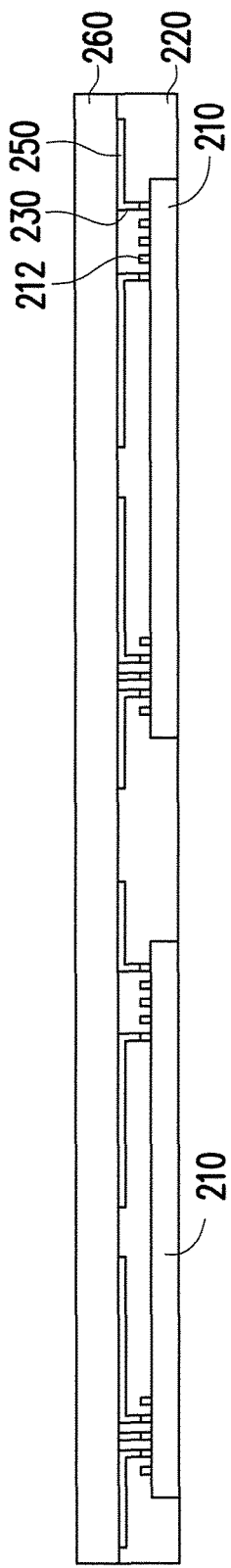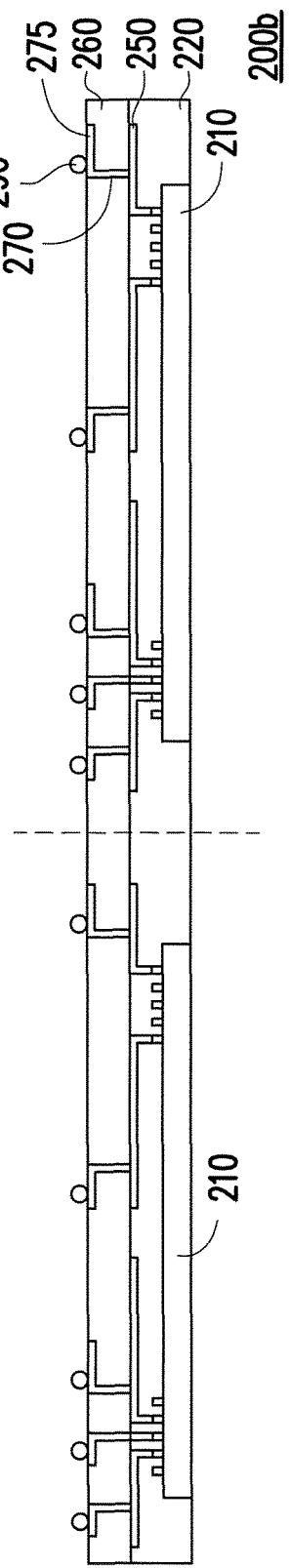
FIG. 22
FIG. 23
FIG. 24

PACKAGE STRUCTURE AND MANUFACTURING METHOD OF PACKAGE STRUCTURE

CROSS-REFERENCE TO RELATED APPLICATION

This is a continuation-in-part application of and claims the priority benefit of U.S. patent application Ser. No. 15/232,808, filed on Aug. 10, 2016, now pending. The prior patent application Ser. No. 15/232,808 is continuation-in-part application of patent application Ser. No. 14/663,447, filed on Mar. 19, 2015, now U.S. Pat. No. 9,451,694, which claims the priority benefit of Taiwan patent application serial no. 103121829, filed on Jun. 24, 2014. This application also claims the priority benefit of Taiwan patent application serial no. 106100819, filed on Jan. 11, 2017. The entirety of each of the above-mentioned patent applications is hereby incorporated by reference herein and made a part of this specification.

BACKGROUND OF THE INVENTION

1. Field of the Invention

The present invention relates to a package structure and a manufacturing method of a package structure, and in particular, to a package structure capable of performing electroplating directly on an insulator thereof, and a manufacturing method thereof.

2. Description of Related Art

In the current information society, dependence of a person on electronic devices increases with each passing day. At the request of high speed, high efficiency, lightness, thinness, shortness, and smallness of the current electronic devices, a soft circuit board having a characteristic of flexibility has been gradually applied to various electronic apparatuses, for example, a mobile phone (Mobile Phone), a notebook PC (Notebook PC), a digital camera (digital camera), a tablet PC (tablet PC), a printer (printer), and a disk player (disk player).

Generally, manufacturing of a circuit board mainly includes: performing pre-processing, sputtering, copper-pressing, or copper-electroplating on one surface or two opposite surfaces of an insulating substrate, and performing a yellow light manufacturing process, to form a circuit layer on the one surface or the two opposite surfaces of the insulating substrate. However, steps of the manufacturing process are complicated, and costs of a manufacturing process of sputtering are relatively high. In addition, a patterned circuit layer formed with a patterned dry film as an electroplating barrier is difficult to meet a requirement for a fine pitch (fine pitch) in current days. Moreover, the material of the insulating substrate mainly uses polyimide or ajinomoto build-up film resin (Ajinomoto build-up film resin), which is quite expensive. Therefore, currently, manufacturing of a package substrate has complicate steps and relatively high costs.

Therefore, how to form a patterned circuit layer on an insulator by directly electroplating and how to apply the technology to a package structure are urgent problems to be resolved in the current field.

SUMMARY OF THE INVENTION

The present invention provides a package structure and a manufacturing method of a package structure, to form a patterned circuit layer on an insulator by direct plating or electroless plating (chemical plating), thereby simplifying a manufacturing process and improving design flexibility of the circuit layout.

A package structure of the present invention includes a substrate, a first insulator, a plurality of first conductive vias, a plurality of pads, and a first patterned circuit layer. The substrate includes a plurality of through holes. The first insulator covers the substrate and is filled in the through holes. The first conductive vias are located in the through holes and penetrate through the first insulator filled in the through holes. The pads are disposed on an upper surface of the first insulator and a lower surface opposite to the upper surface and electrically connected to the first conductive vias, and a bottom surface of each pad is lower than the upper surface of the first insulator. The first patterned circuit layer is disposed on the upper surface of the first insulator and connected to the first conductive vias and the pads. A bottom surface of the first patterned circuit layer is lower than the upper surface of the first insulator.

A package structure of the present invention includes a substrate, a first insulator, a plurality of first conductive vias, and a first patterned circuit layer. The substrate includes a plurality of electrical contacts, a top surface, and a bottom surface opposite to the top surface, where the electrical contacts are disposed on the top surface. The first insulator is disposed on the substrate and at least covers the top surface and the bottom surface. The first conductive vias are disposed on the first insulator and electrically connected to the electrical contacts. The first patterned circuit layer is disposed on a first surface of the first insulator and electrically connected to the first conductive vias. A lower surface of the first patterned circuit layer is lower than the first surface of the first insulator.

A manufacturing method of a package structure of the present invention includes the following steps. A first insulator is provided. A plating resist film is formed on the first insulator. A plurality of circuit grooves are formed on the first insulator by laser, where an inner wall of each circuit groove is a coarse surface. A seed layer is formed in the circuit groove. A patterned circuit layer is formed on the first insulator by using the seed layer as a conductive path, and the patterned circuit layer is filled in the circuit grooves, where a bottom surface of the patterned circuit layer is lower than an upper surface of the first insulator.

In an embodiment of the present invention, a material of the first insulator includes epoxide (epoxy), diallyl phthalate (DAP), benzocyclobutene (BCB), polyester, acrylic ester, fluorine polymer, polyphenylene oxide, polyimide, phenol formaldehyde resin, polysulfone, silicon polymer, BT modified epoxy resin (Bismaleimide-Triazine modified epoxy resin), isocyanate polyester, polyethylene, polycarbonate resin, acrylonitrile-butadiene-styrene copolymer, polyethylene terephthalate (PET), polybutylene terephthalate (PBT), liquid crystal polyester (liquid crystal polyester, LCP), polyamide (PA), nylon 6, polyoxymethylene (POM), polyphenylene sulfide (PPS), polycarbonate (polycarbonate, PC), polymethacrylate (polymethacrylate, PMMA), ABS resin (Acrylonitrile Butadiene Styrene, ABS) or cyclic olefin copolymer (COC).

In an embodiment of the present invention, the first insulator at least covers a top surface of the substrate and a bottom surface opposite to the top surface, and each through hole penetrates through the top surface and the bottom surface.

In an embodiment of the present invention, the package structure further includes at least one first semiconductor device that is disposed on the upper surface of the first insulator and electrically connected to the first conductive vias.

In an embodiment of the present invention, the at least one first semiconductor device includes a plurality of active components and/or a plurality of passive components.

In an embodiment of the present invention, the package structure further includes a second insulator that is disposed on the upper surface of the first insulator and that covers the first semiconductor device and the pads.

In an embodiment of the present invention, a material of the second insulator includes epoxide (epoxy), diallyl phthalate (DAP), benzocyclobutene (BCB), polyester, acrylic ester, fluorine polymer, polyphenylene oxide, polyimide, phenol formaldehyde resin, polysulfone, silicon polymer, BT modified epoxy resin (Bismaleimide-Triazine modified epoxy resin), isocyanate polyester, polyethylene, polycarbonate resin, acrylonitrile-butadiene-styrene copolymer, polyethylene terephthalate (PET), polybutylene terephthalate (PBT), liquid crystal polyester (liquid crystal polyester, LCP), polyamide (PA), nylon 6, polyoxymethylene (POM), polyphenylene sulfide (PPS), polycarbonate (polycarbonate, PC), polymethacrylate (polymethacrylate, PMMA), ABS resin (Acrylonitrile Butadiene Styrene, ABS) or cyclic olefin copolymer (COC).

In an embodiment of the present invention, the package structure further includes a plurality of second conductive vias that penetrate through the second insulator and that are connected to the pads.

In an embodiment of the present invention, the package structure further includes at least one second semiconductor device which is disposed on the second insulator and electrically connected to the second conductive vias.

In an embodiment of the present invention, the at least one second semiconductor device includes a plurality of active components and/or a plurality of passive components.

In an embodiment of the present invention, the package structure further includes a second patterned circuit layer disposed on an upper surface of the second insulator.

In an embodiment of the present invention, a bottom surface of the second patterned circuit layer is lower than the upper surface of the second insulator.

In an embodiment of the present invention, the package structure further includes a plurality of solder balls disposed on a lower surface opposite to the upper surface of the first insulator and electrically connected to the first conductive vias.

In an embodiment of the present invention, the substrate further includes a plurality of substrate through holes penetrating through the substrate and electrically connected to the top surface and the bottom surface of the substrate.

In an embodiment of the present invention, the package structure further includes a plurality of second conductive vias and a second patterned circuit layer. The second conductive vias penetrate through the first insulator which covers the bottom surface and the second conductive vias are electrically connected to the substrate through holes. The second patterned circuit layer is disposed on a second surface of the first insulator which covers the bottom surface and the second patterned circuit layer is electrically connected to the second conductive vias. A lower surface of the second patterned circuit layer is lower than the second surface of the first insulator.

In an embodiment of the present invention, the package structure further includes at least one semiconductor device that is disposed on the insulator and is electrically connected to the first patterned circuit layer and/or the second patterned circuit layer.

In an embodiment of the present invention, the first insulator includes a tape-shaped insulator.

In an embodiment of the present invention, the step of providing the first insulator includes: providing a substrate on the first insulator, where the first insulator at least covers a top surface of the substrate and a bottom surface opposite to the top surface; and forming a plurality of conductive vias on the first insulator, where a patterned circuit layer is electrically connected to the conductive vias.

In an embodiment of the present invention, the step of forming the conductive vias on the first insulator includes: forming a plurality of vias on the first insulator by laser or plasma, where the vias are respectively located in the through holes and penetrate through the first insulator filled in the through holes; and performing an electroplating manufacturing process on the vias to form the conductive vias.

In an embodiment of the present invention, the substrate is a wafer including a plurality of electrical contacts, and the conductive vias are connected to the electrical contacts.

In an embodiment of the present invention, the wafer further includes a plurality of through silicon vias and is electrically connected to the electrical contacts.

In an embodiment of the present invention, the manufacturing method of a package structure further includes: providing a semiconductor device on the first insulator, where the semiconductor device is electrically connected to the patterned circuit layer.

Based on the above, in the present invention, grooves corresponding to a conductive structure such as a circuit, a pad, and a conductive via, etc., are formed on an insulator by laser, plasma, or mechanical drilling. Surfaces of the grooves formed by laser, plasma, or mechanical drilling are relatively coarse and are therefore suitable for absorbing seed crystal in chemical plating solution. Therefore, according to the manufacturing method of a package structure of the present invention, a chemical plating process may be performed on a first insulator to form a seed layer in the grooves, and an electroplating process is performed by using the seed layer as the conductive path, so as to form the conductive structure filled in the grooves such as the circuit, the pad, and the conductive via, etc. In this way, according to the package structure and the manufacturing method of a package structure of the present invention, the conductive structure such as the circuit, the pad, and the conductive via may be formed after direct chemical plating and electroplating is performed on the insulator, so that a manufacturing process of the package structure may be effectively simplified. In addition, according to the present invention, the insulator may be chemically plated and electroplated after a corresponding groove pattern is carved on the insulator by laser, plasma, or mechanical drilling, so that design flexibility of circuit layout may be significantly improved.

To make the foregoing characteristics and advantages of the present invention more comprehensible, detailed description is made below with reference to the accompanying drawings by using embodiments.

BRIEF DESCRIPTION OF THE DRAWINGS

FIG. 15 to FIG. 18 are partial schematic cross-sectional views of a manufacturing method of a package structure according to another embodiment of the present invention.

FIG. 22 to FIG. 24 are partial schematic cross-sectional views of a manufacturing method of a package structure according to another embodiment of the present invention.

DESCRIPTION OF THE EMBODIMENTS

Embodiments of the present invention will be illustrated below with the accompanying drawings. The directional terms mentioned in the present invention, like "above", "below", "front", "back", "left", and "right", refer to the directions in the appended drawings. Therefore, the directional terms are merely used for illustration instead of limiting the present invention.

Figure 1:
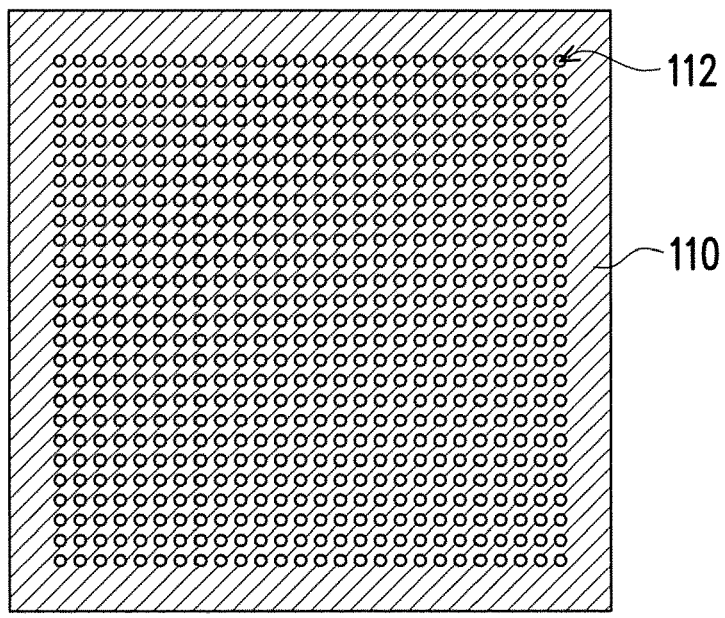
FIG. 1 to FIG. 3 are schematic top views of a partial manufacturing process of a package structure according to an embodiment of the present invention.
Figure 2:
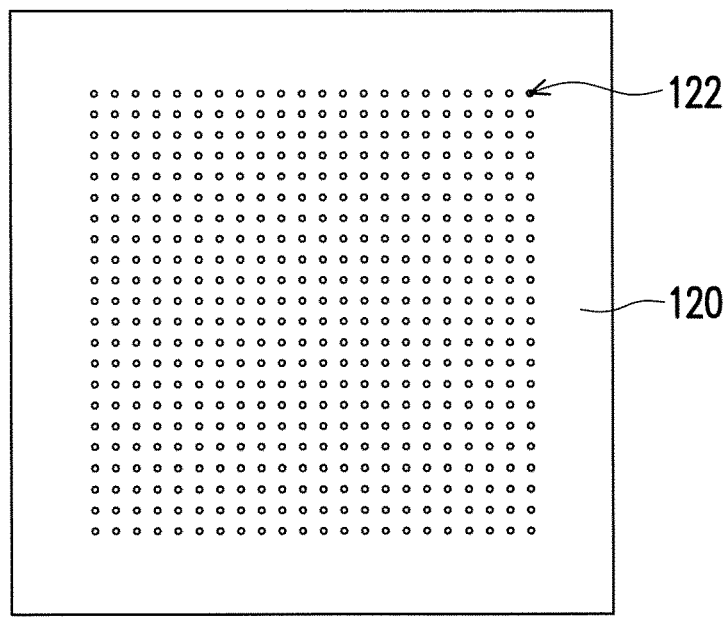
Figure 3:
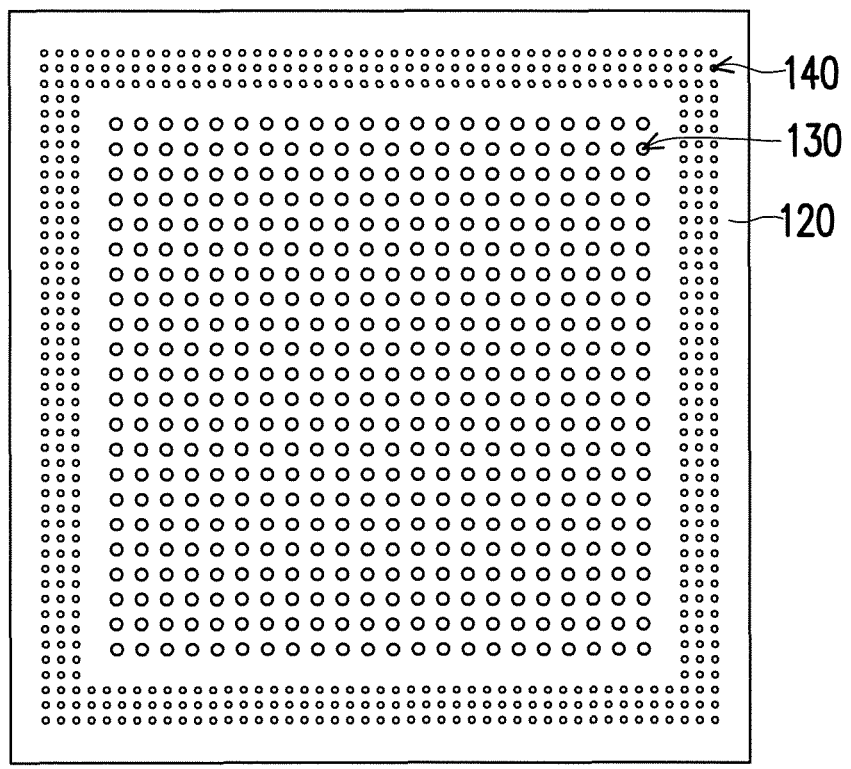
Figure 4:
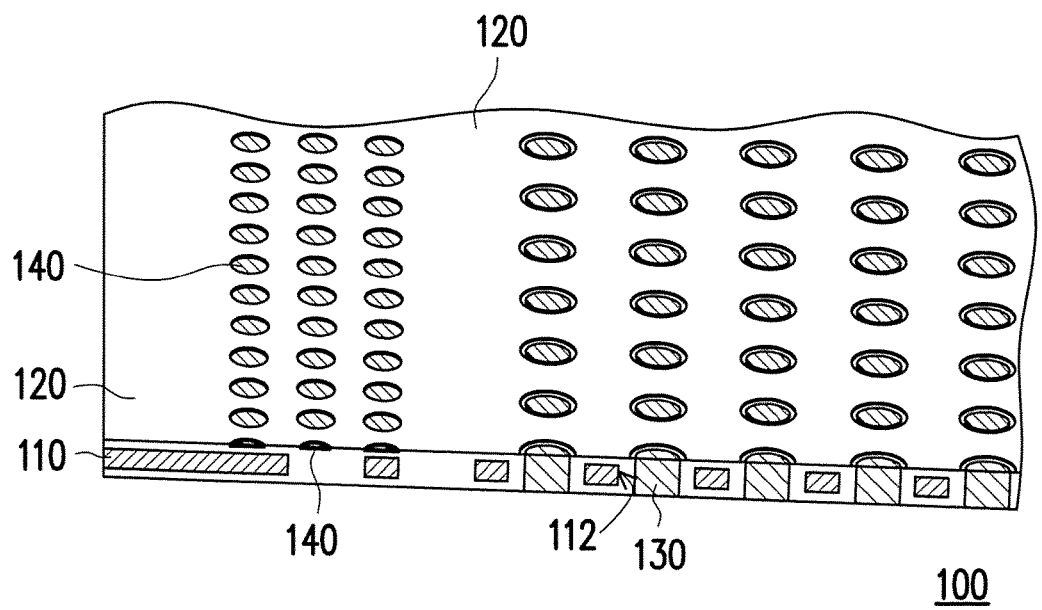
FIG. 4 is a partial schematic cross-sectional view of the package structure in FIG. 3.
Figure 5:
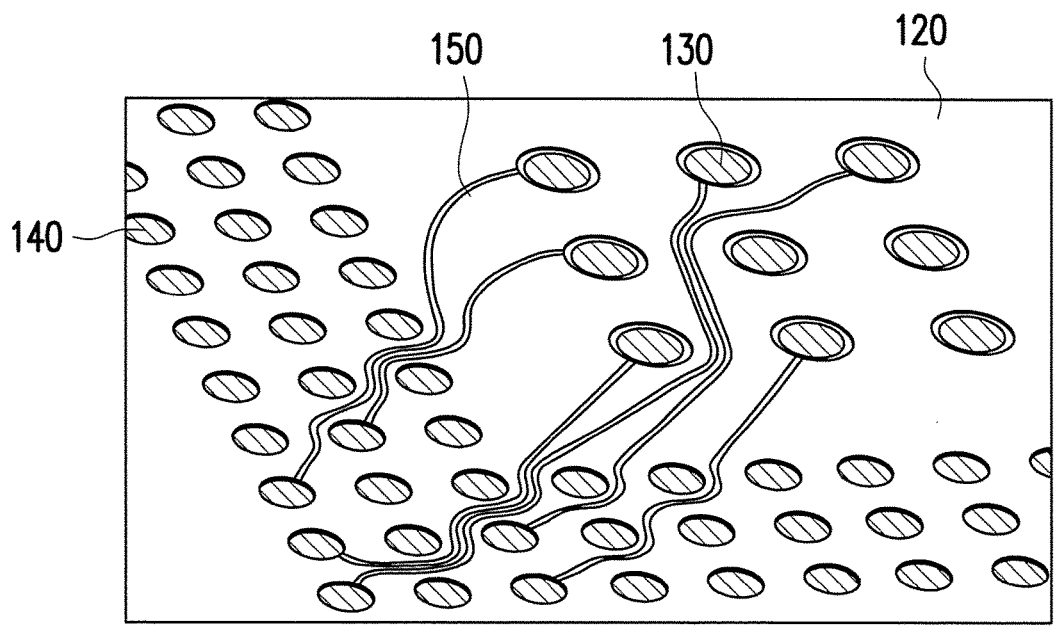
FIG. 5 is a partially enlarged schematic view of a package structure according to an embodiment of the present invention.

FIG. 1 to FIG. 3 are schematic top views of a partial manufacturing process of a package structure according to an embodiment of the present invention. FIG. 4 is a partial schematic cross-sectional view of the package structure in FIG. 3. FIG. 5 is a partially enlarged schematic view of a package structure according to an embodiment of the present invention. In the present embodiment, a package structure 100 may include a substrate 110, a first insulator 120, a plurality of first conductive vias 130, and a plurality of pads 140 shown in FIG. 4 and a first patterned circuit layer 150 shown in FIG. 5. As shown in FIG. 1, the substrate 110 may include a plurality of through holes 112, and the through holes 112 may be arranged in an array. In the present embodiment, the substrate 110 may be a lead frame. As shown in FIG. 2 and FIG. 4, the first insulator 120 may cover the substrate 110 and is filled in the through holes 112 of the substrate 110. In the present embodiment, as shown in FIG. 4, the first insulator 120 at least covers a top surface and a bottom surface opposite to the top surface of the substrate 110, and each through hole 112 connects the top surface and the bottom surface of the substrate 110. As shown in FIG. 4, the first conductive vias 130 are located in the through holes 112 and penetrate through the first insulator 120 which is filled in the through holes 112.

Specifically, a manufacturing method of the first conductive vias 130 may include the following steps. First, after the first insulator 120 covering the substrate 110 is formed, a plating resist film is formed on the first insulator 120, where the plating resist film completely covers a surface of the first insulator 120. Next, a plurality of vias 122 shown in FIG. 2 are formed by laser, plasma, or mechanical drilling on the first insulator 120. The vias 122 are respectively located in the through holes 112 of the substrate and penetrate through the first insulator 120. Afterwards, an electroplating process is performed on the first insulator 120. In this way, since inner walls of the vias 122 are not covered by the plating resist film and the inner walls of the vias 122 are coarse surfaces, the inner walls may be electroplated to form the conductive vias 130 shown in FIG. 4. Specifically, the inner walls of the vias 122 formed by laser, plasma, or mechanical drilling are relatively coarse and suitable for absorbing seed crystal in chemical plating solution. Therefore, an electroplating process of the present embodiment includes the following steps. A chemical plating process is firstly performed on the first insulator 120 to form a seed layer in the vias 122, and then an electroplating process is performed by using the seed layer as a conductive path to form the conductive vias 130 shown in FIG. 4.

In the present embodiment, the pads 140 may be disposed on an upper surface and a lower surface opposite to the upper surface of the first insulator 120 and electrically connected to the first conductive vias 130 by using the first patterned circuit layer 150 shown in FIG. 5. The first patterned circuit layer 150 is disposed on the upper surface of the first insulator 120 and connected to the first conductive vias 130 and the pads 140. Further, the pads 140 and the first patterned circuit layer 150 may be formed in a manufacturing process similar to the foregoing manufacturing process, that is, for example, when the vias 122 are formed in the present embodiment, a plurality of grooves corresponding to the pads 140 and the first patterned circuit layer 150 may be formed at the same time on the first insulator 120 by laser or mechanical drilling. Afterwards, an electroplating process is performed on the first insulator 120. In this way, the grooves corresponding to the pads 140 and the first patterned circuit layer 150 are not covered by the plating resist film, and inner walls of the grooves are coarse surfaces, so that the grooves may be electroplated to form the pads 140 and the first patterned circuit layer 150 shown in FIG. 5. In an embodiment, the package structure 100 may further include a bottom surface patterned circuit layer, which may be disposed on a lower surface of the first insulator 120 and connected to the first conductive vias 130 and the pads 140, and a bottom surface of the bottom surface patterned circuit layer 155 is lower than the lower surface of the first insulator 120.

Specifically, surfaces of the grooves formed by laser, plasma, or mechanical drilling are relatively coarse and are therefore suitable for absorbing seed crystal in chemical plating solution. Therefore, an electroplating process of the present embodiment includes the following steps. A chemical plating process is firstly performed on the first insulator 120 to form a seed layer in the grooves, and then an electroplating process is performed by using the seed layer as a conductive path to form the pads 140 and the first patterned circuit layer 150 filled in the grooves. Therefore, a bottom surface of the pads 140 formed according to the foregoing process is lower than the upper surface of the first insulator 120, and a bottom surface of the first patterned circuit layer 150 is lower than the upper surface of the first insulator 120. In other words, the pads 140 and the first patterned circuit layer 150 formed according to the foregoing process are embedded in the first insulator 120.

In the present embodiment, a material of the first insulator 120 includes epoxide (epoxy), diallyl phthalate (DAP), benzocyclobutene (BCB), polyester, acrylic ester, fluorine polymer, polyphenylene oxide, polyimide, phenol formaldehyde resin, polysulfone, silicon polymer, BT modified epoxy resin (Bismaleimide-Triazine modified epoxy resin), isocyanate polyester, polyethylene, polycarbonate resin, acrylonitrile-butadiene-styrene copolymer, polyethylene terephthalate (PET), polybutylene terephthalate (PBT), liquid crystal polyester (liquid crystal polyester, LCP), polyamide (PA), nylon 6, polyoxymethylene (POM), polyphenylene sulfide (PPS), polycarbonate (polycarbonate, PC), polymethacrylate (polymethacrylate, PMMA), ABS resin (Acrylonitrile Butadiene Styrene, ABS) or cyclic olefin copolymer (COC).

In addition, in the present embodiment, the plating resist film is selectively removed by laser, plasma, or mechanical drilling and a surface of the plating resist film is coarsened, so that the electroplating process may be directly performed on the first insulator 120 to form a conductive structure such as the conductive vias 130, the pads 140, and the patterned circuit layer 150. Therefore, the first insulator 120 of the present embodiment does not need to mix with metal oxide complex which may be activated by laser, plasma, or a mechanical cutting tool, etc., so as to be capable of performing metallization coating thereon. That is, the material of the first insulator 120 of the present embodiment may not include the metal oxide complex such as zinc, copper, silver, gold, nickel, palladium, platinum, cobalt, rhodium, iridium, indium, iron, manganese, aluminum, chromium, tungsten, vanadium, tantalum, or titanium. Certainly, the present embodiment is merely used as an example for description, and the present invention is not limited thereto.

Figure 6:
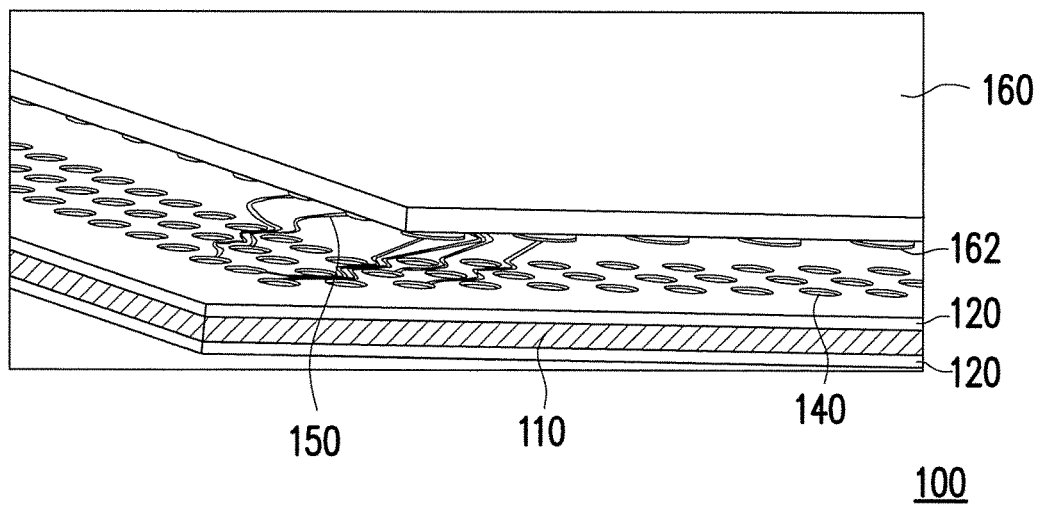
FIG. 6 is a partial schematic view of a package structure according to an embodiment of the present invention.
Figure 7:
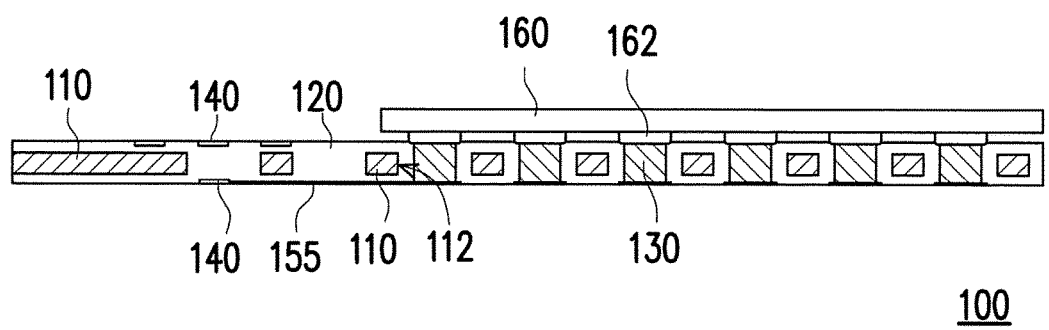
FIG. 7 is a partial schematic cross-sectional view of a package structure according to an embodiment of the present invention.

FIG. 6 is a partial schematic view of a package structure according to an embodiment of the present invention. FIG. 7 is a partial schematic cross-sectional view of a package structure according to an embodiment of the present invention. Referring to FIG. 6 and FIG. 7 together, in the present embodiment, the package structure 100 may further include at least one first semiconductor device 160. As shown in FIG. 7, the first semiconductor device 160 is disposed on the upper surface of the first insulator 120 and electrically connected to the first conductive vias 130 by using a solder pad 162. Specifically, the first semiconductor device 160 may include a plurality of active components and/or a plurality of passive components, and a type and a quantity of the first semiconductor devices 160 are not limited in the present embodiment.

Figure 8A:
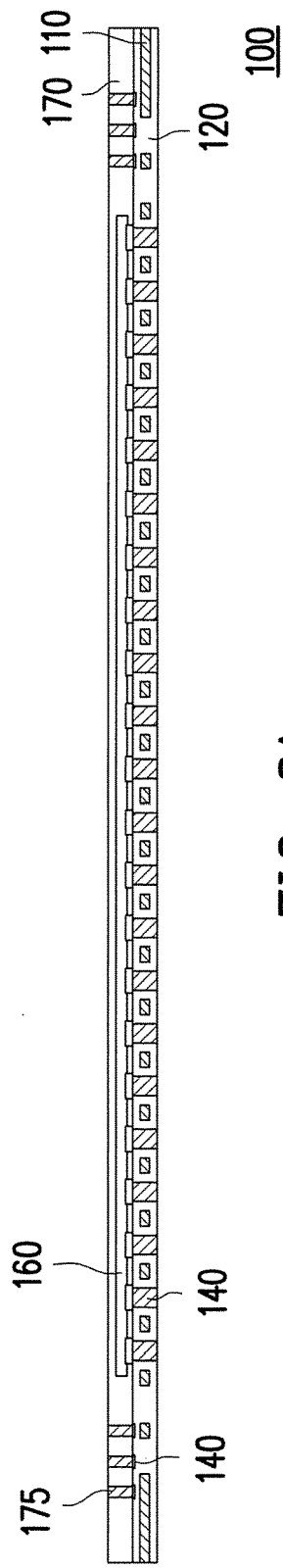
FIG. 8A is a schematic cross-sectional view of a package structure according to an embodiment of the present invention.
Figure 8B:
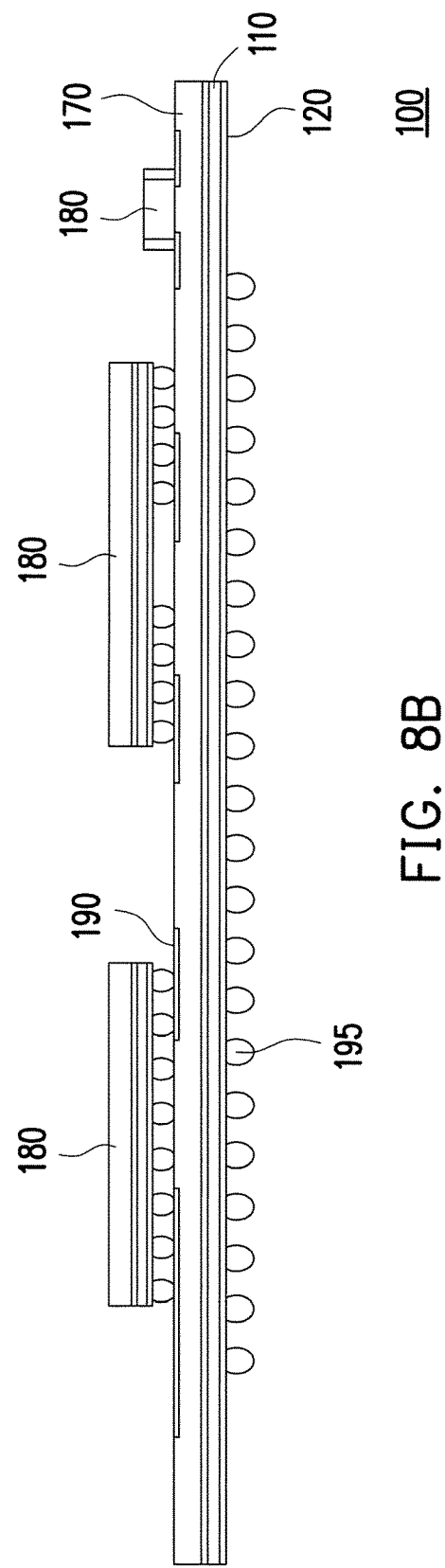
FIG. 8B is a schematic side view of a package structure according to an embodiment of the present invention.

FIG. 8A is a schematic cross-sectional view of a package structure according to an embodiment of the present invention. FIG. 8B is a schematic side view of a package structure according to an embodiment of the present invention. Referring to FIG. 8A and FIG. 8B together, in the present embodiment, the package structure 100 may further include a second insulator 170 and a plurality of second conductive vias 175. As shown in FIG. 8, the second insulator 170 is disposed on the upper surface of the first insulator and covers the first semiconductor device 160 and the pads 140. The second conductive vias 175 penetrate through the second insulator 170 and are connected to the pads 140. In the present embodiment, a material of the second insulator 170 may be the same as that of the first insulator 120 and may include epoxide (epoxy), diallyl phthalate (DAP), benzocyclobutene (BCB), polyester, acrylic ester, fluorine polymer, polyphenylene oxide, polyimide, phenol formaldehyde resin, polysulfone, silicon polymer, BT modified epoxy resin (Bismaleimide-Triazine modified epoxy resin), isocyanate polyester, polyethylene, polycarbonate resin, acrylonitrile-butadiene-styrene copolymer, polyethylene terephthalate (PET), polybutylene terephthalate (PBT), liquid crystal polyester (liquid crystal polyester, LCP), polyamide (PA), nylon 6, polyoxymethylene (POM), polyphenylene sulfide (PPS), polycarbonate (polycarbonate, PC), polymethacrylate (polymethacrylate, PMMA), ABS resin (Acrylonitrile Butadiene Styrene, ABS) or cyclic olefin copolymer (COC).

Similarly, a plating resist film on a surface of the second insulator 170 of the present embodiment may be selectively removed by laser, plasma, or mechanical drilling and the surface of the second insulator 170 may be coarsened, so that the second insulator 170 may be directly electroplated to form a conductive structure such as the second conductive vias 175. Therefore, the second insulator 170 of the present embodiment does not need to mix a metal oxide complex suitable for being activated by laser, plasma, or the mechanical cutting tool, etc., so as to be capable of performing metallization coating thereon. That is, the material of the second insulator 170 of the present embodiment may not include the metal oxide complex such as zinc, copper, silver, gold, nickel, palladium, platinum, cobalt, rhodium, iridium, indium, iron, manganese, aluminum, chromium, tungsten, vanadium, tantalum, or titanium. Certainly, the present embodiment is merely used as an example for description, and the present invention is not limited thereto.

In the present embodiment, the package structure 100 may further include at least one second semiconductor device 180, a second patterned circuit layer 190, and a plurality of solder balls 195 that are shown in FIG. 8B. The second semiconductor device 180 is disposed on the second insulator 170 and is electrically connected to the second conductive vias 175 shown in FIG. 8A. The second patterned circuit layer 190 is disposed on an upper surface of the second insulator 170 and is electrically connected to the second semiconductor device 180, and the solder balls 195 are disposed on the lower surface of the first insulator 120 and are electrically connected to the first conductive vias 130, so that the package structure 100 may be connected to another electronic apparatus by using the solder balls 195. In the present embodiment, the second semiconductor device 180 may include a plurality of active components and/or a plurality of passive components. Certainly, the present embodiment is merely used as an example for description, and a type and a quantity of the second semiconductor devices 180 are not limited in the present invention.

In the present embodiment, a manufacturing method of the second patterned circuit layer 190 may be similar to that of the patterned circuit layer 150, that is, circuit grooves corresponding to the second patterned circuit layer 190 are carved by laser, plasma, or mechanical drilling, etc., and surfaces of the circuit grooves are coarsened, so that the circuit grooves are suitable for absorbing seed crystal in chemical plating solution. In this way, in the present embodiment, a chemical plating process may firstly be performed on the second insulator 170 to form a seed layer in the circuit grooves, and then an electroplating process is performed by using the seed layer as a conductive path to form the second patterned circuit layer 190 filled in the circuit grooves. Therefore, a bottom surface of the second patterned circuit layer 190 formed by the foregoing manufacturing process is lower than the upper surface of the second insulator 170. In other words, the second patterned circuit layer 190 formed by the foregoing manufacturing process is embedded in the second insulator 170.

Figure 9:
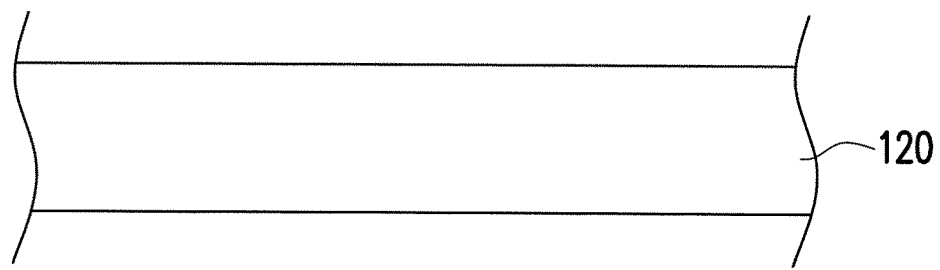
FIG. 9 to FIG. 14 are partial schematic cross-sectional views of a manufacturing method of a package structure according to an embodiment of the present invention.
Figure 10:
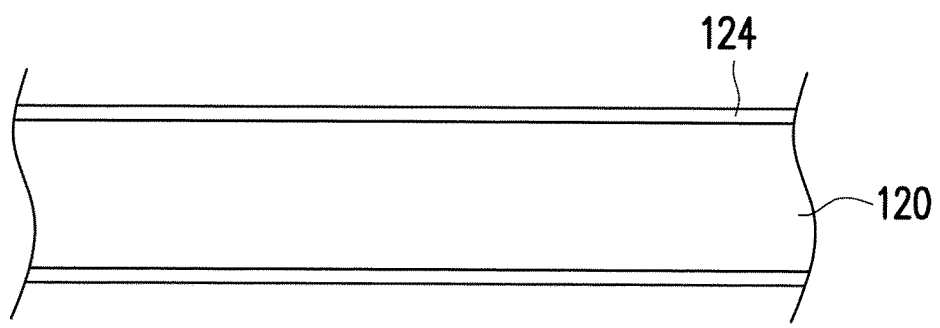
Figure 11:
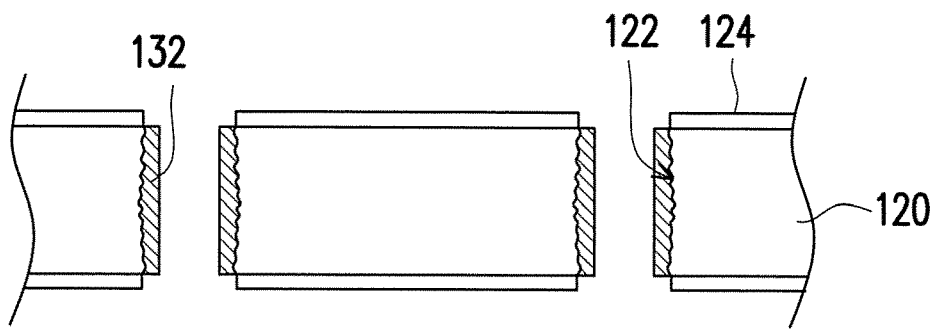
Figure 12:
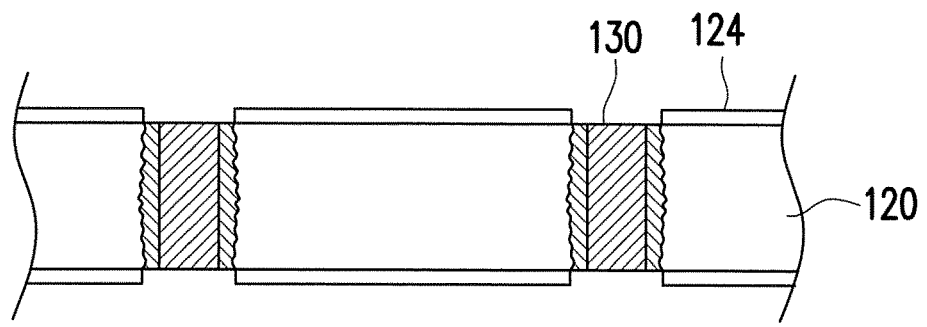
Figure 13:
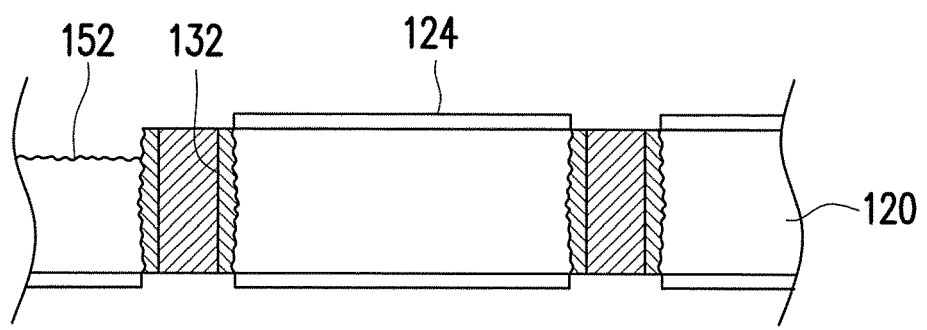
Figure 14:
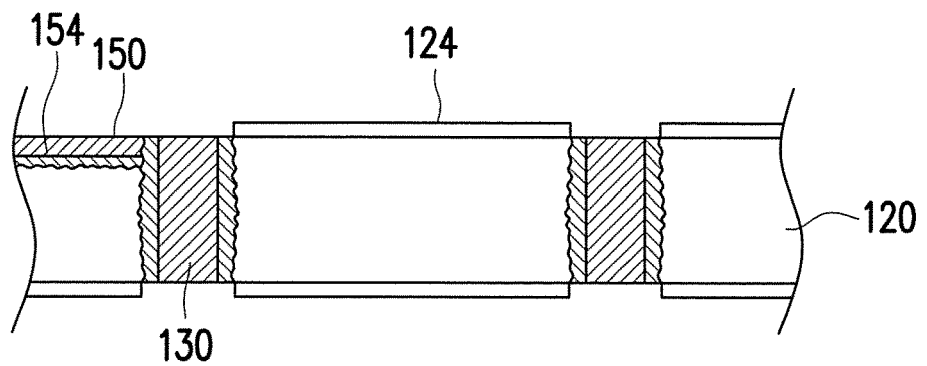

FIG. 9 to FIG. 14 are partial schematic cross-sectional views of a manufacturing method of a package structure according to an embodiment of the present invention. The manufacturing method of a package structure may be derived from the package structure 100 and may include the following steps. First, an insulator 120 shown in FIG. 9 is provided. Afterwards, referring to FIG. 10, a plating resist film 124 is formed on the insulator 120, where the plating resist film 124 may, for example, completely cover a surface of the insulator 120. Next, the plating resist film 124 may be baked, and circuit grooves 152 shown in FIG. 13 are formed by laser, plasma, or a mechanical cutting tool on the insulator 120, and then a cleaning and backing process is performed on the insulator 120. In the present embodiment, an inner wall of each circuit grooves 152 carved by laser, plasma, or the mechanical cutting tool is a coarse surface and is therefore suitable for absorbing seed crystal in chemical plating solution. Therefore, a chemical plating manufacturing process may be performed on the insulator 120, and the cleaning and roasting manufacturing process may be performed on the insulator 120, to enable coarse surfaces of the circuit grooves 152 to absorb the seed crystal in the chemical plating solution and to form a seed layer 154 in the circuit grooves 152 shown in FIG. 14. Next, a patterned circuit layer 150 shown in FIG. 14 is formed on the insulator 120 by using the seed layer 154 as a conductive path. The patterned circuit layer 150 is filled in the circuit grooves 152, and a bottom surface of the patterned circuit layer 150 is lower than an upper surface of the insulator 120.

In the present embodiment, the insulator 120 may be a tape-shaped insulator, so that the foregoing consecutive manufacturing process may be performed in a reel-to-reel (reel to reel) manner. The insulator 120 may be polyimide (polyimide) and used as an insulating film of a chip on film (chip on film, COF), or may be a pre-preg (pre-preg) applied to a ball grid array (Ball Grid Array, BGA), a high density interconnect (High Density Interconnect, HDI) substrate, or a land grid array (Land Grid Array, LGA). A material of the insulator 120 may be the same as that of the foregoing first insulator 120 and the second insulator 170.

In addition, in the manufacturing method of a package structure of the present embodiment, after the plating resist film 124 is formed, conductive vias 130 may be formed in a similar manner. Specifically, in the present embodiment, a plurality of vias 122 may be formed on the insulator 120 by laser, plasma, or a mechanical cutting tool. In this way, inner walls of the vias 122 formed by laser, plasma, or mechanical cutting tool for drilling holes are coarse surfaces shown in FIG. 11 and are therefore suitable for absorbing the seed crystal in the chemical plating solution. Therefore, a chemical plating manufacturing process may be performed to form a seed layer 132 shown in FIG. 11 in the vias 122. Next, the conductive vias 130 shown in FIG. 12 are formed by using the seed layer 132 as a conductive path. In the present embodiment, the patterned circuit layer 150 is electrically connected to the conductive vias 130, and the conductive vias 130 and the patterned circuit layer 150 may be formed at the same time, or may be formed one after another as shown in FIG. 9 to FIG. 14. A time sequence of manufacturing process of the conductive vias 130 and the patterned circuit layer 150 is not limited in the present invention.

In an embodiment, the insulator 120 may be provided on a substrate 110, and the insulator 120 at least covers a top surface and a bottom surface opposite to the top surface of the substrate 110. In the present embodiment, the substrate 110 may be a lead frame shown in FIG. 1 including a plurality of through holes 112. A structure of the present embodiment may be the package structure 100 shown in FIG. 4, and the conductive vias 130 may be the first conductive vias 130 located in the through holes 112 of the substrate 110 and penetrate through the insulator 120 filled in the through holes 112. In this way, manufacturing of the package structure of the present embodiment may be roughly completed.

FIG. 15 to FIG. 18 are partial schematic cross-sectional views of a manufacturing method of a package structure according to another embodiment of the present invention. It should be noted herein that the manufacturing method of a package structure of the present embodiment is similar to the foregoing embodiments. Therefore, reference numbers of components and partial content of the foregoing embodiments are still used in the present embodiment. A similar reference number is used to indicate a same or similar component, and a description of content of a same technology is omitted. For a description of an omitted part, refer to the foregoing embodiments, and details are not described in the present embodiment.

Figure 15:
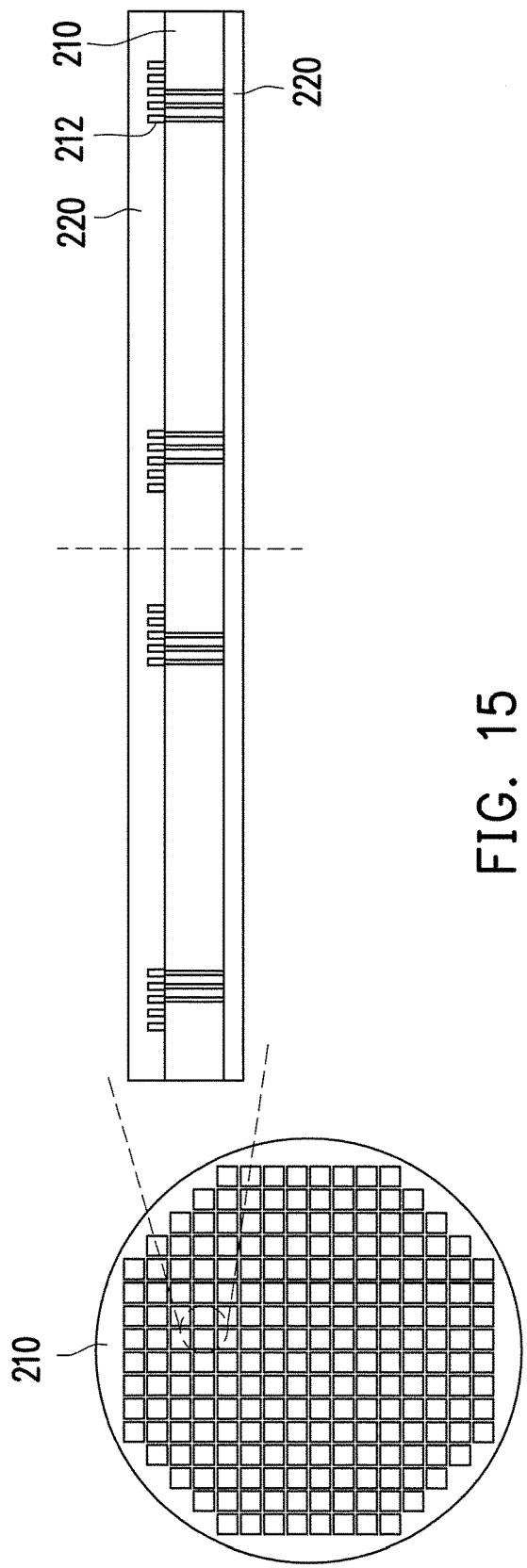

In the present embodiment, according to the manufacturing method of a package structure, an insulator 220 is first provided on a substrate 210. The substrate 210 may be a wafer 210 shown in FIG. 15 including a plurality of electrical contacts 212. In an embodiment, the wafer 210 may further include a plurality of through silicon vias 214, and the electrical contacts 212 may be selectively electrically connected to the through silicon vias 214 according to actual requirement. In the present embodiment, the wafer 210 may be formed by a plurality of chips arranged in an array, and the insulator 220 covers the wafer. As shown in FIG. 15, the insulator 220 may at least cover a top surface and/or a bottom surface of the wafer 210 and cover the electrical contacts 212. Generally, the insulator 220 may at least cover the top surface of wafer 210. In the embodiment in which the wafer 210 includes a plurality of through silicon vias 214, the insulator 220 may at least cover the top surface and the bottom surface of the wafer 210. It should be noted that for conciseness of the drawings, FIG. 15 to FIG. 18 merely draw schematic cross-sectional views of a manufacturing process of two chips in the wafer 210, and any person of ordinary skill in the art should understand that the manufacturing process shown in FIG. 15 to FIG. 18 may be implemented on the entire wafer 210.

Figure 16:
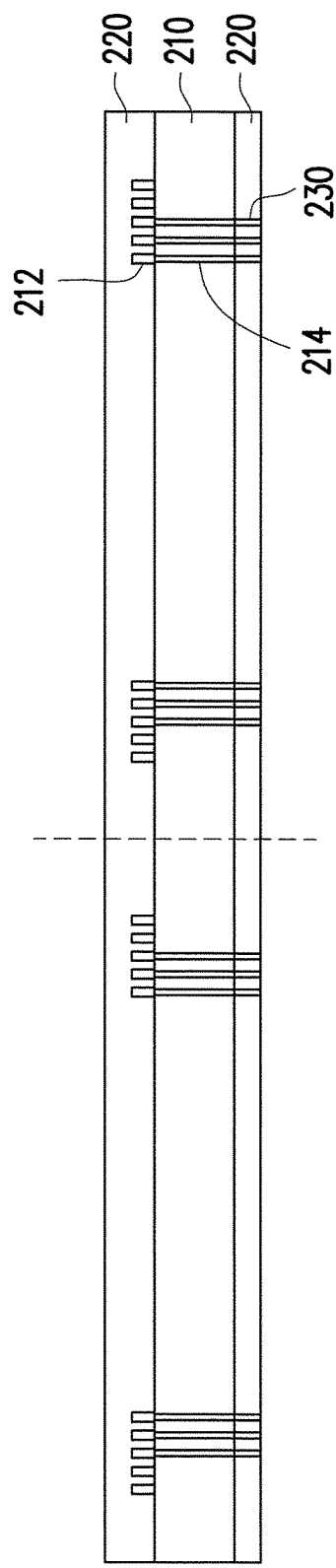

Afterwards, conductive vias 230 may be formed by coarsening with laser, plasma, or direct electroplating, similar to the manufacturing method of the first conductive vias 130, so that the conductive vias penetrate through the insulator 220 and are electrically connected to the electrical contacts 212 as shown in FIG. 16.

Afterwards, a patterned circuit layer 250 may be formed by coarsening with laser, plasma or a mechanical cutting tool, and direct electroplating, similar to the manufacturing method of the first patterned circuit layer 150. The patterned circuit layer 250 is electrically connected to the conductive vias 230 and the electrical contacts 212. Next, as shown in FIG. 18, at least one semiconductor device 280 is disposed on the insulator 220, and the semiconductor device 280 is electrically connected to the patterned circuit layer 250. In this way, manufacturing of a package structure 200 of the present embodiment may be substantially completed.

In a structure, the package structure 200 manufactured according to the manufacturing method above may include the substrate 210, an insulator, a plurality of first conductive vias, and a first patterned circuit layer. As shown in FIG. 15, the substrate 210 may include a plurality of electrical contacts 212 and a plurality of substrate through holes 214. In the present embodiment, the substrate 210 may be one of the chips in a wafer shown in FIG. 15. Further, the substrate through holes 214 may be the through silicon vias 214 of a chip. The substrate through holes 214 penetrate through the substrate 210 and are electrically connected to a top surface and a bottom surface of the substrate 210. The electrical contacts 212 may be, for example, disposed on the top surface of the substrate 210. The insulator 220 is disposed on the substrate 210 and at least covers the top surface and the bottom surface of the substrate 210. The first conductive vias 230 are disposed on the insulator 220 and electrically connected to the electrical contacts 212. Specifically, the first conductive vias 230 may be disposed on the insulator 220 which covers the top surface of the substrate 210 and the first conductive vias 230 are electrically connected to the electrical contacts 212. The patterned circuit layer 250 includes a first patterned circuit layer and a second patterned circuit layer, and the first patterned circuit layer 250 may be disposed on a first surface of the insulator 220 which covers the top surface of the substrate 210 and the first patterned circuit layer 250 is electrically connected to the first conductive vias 230. A lower surface of the first patterned circuit layer 250 is lower than the first surface of the insulator 220.

In the present embodiment, the package structure 200 further includes a plurality of second conductive vias 230. The second conductive vias 230 penetrate through the insulator 220 which covers the bottom surface of the substrate 210 and the second conductive vias 230 are electrically connected to the substrate through holes 214. The second patterned circuit layer 250 is disposed on a second surface of the insulator 220 which covers the bottom surface of the substrate 210 and the second patterned circuit layer 250 is electrically connected to the second conductive vias 230. A lower surface of the second patterned circuit layer 250 is lower than the second surface of the insulator 220. In addition, the package structure 200 may further include at least one semiconductor device 280, which is disposed on the insulator 220 and electrically connected to the first and/or the second patterned circuit layer 250. In the present embodiment, a layer of the insulator 220 is merely for illustration, but a quantity of the insulators is not limited in the present invention, and the manufacturing process shown in FIG. 15 to FIG. 18 may be repeated according to an actual requirement of the product, and a plurality of circuit layers and insulators may be successively stacked on the insulator 220.

FIG. 19 to FIG. 22 are partial schematic cross-sectional views of a manufacturing method of a package structure according to another embodiment of the present invention. It should be noted herein that the manufacturing method of a package structure of the present embodiment is similar to the foregoing embodiments. Therefore, reference numbers of components and partial content of the foregoing embodiments are still used in the present embodiment. A similar reference number is used to indicate a same or similar component, and a description of content of a same technology is omitted. For a description of an omitted part, refer to the foregoing embodiments, and details are not described in the present embodiment.

Figure 19:
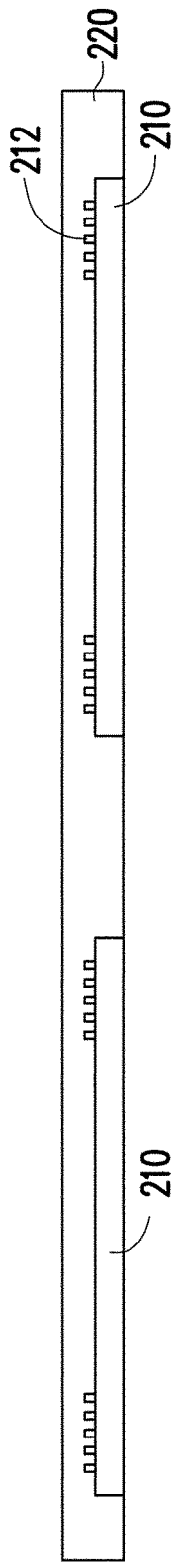
FIG. 19 to FIG. 21 are partial schematic cross-sectional views of a manufacturing method of a package structure according to another embodiment of the present invention.

Referring to FIG. 19, in a manufacturing method of a package structure of the present embodiment, a first insulator 220 is first provided on a substrate 210. The first insulator 220 covers a top surface and a side surface of the substrate (wafer) 210, and the substrate 210 may be a wafer 210 including a plurality of electrical contacts 212. In the present embodiment, the wafer 210 may be formed by a plurality of chips arranged in an array, and the first insulator 220 covers the wafer. In the present embodiment, as shown in FIG. 19, the first insulator 220 may at least cover the top surface and the side surface of the substrate (wafer) 210, and cover the electrical contacts 212.

Figure 20:
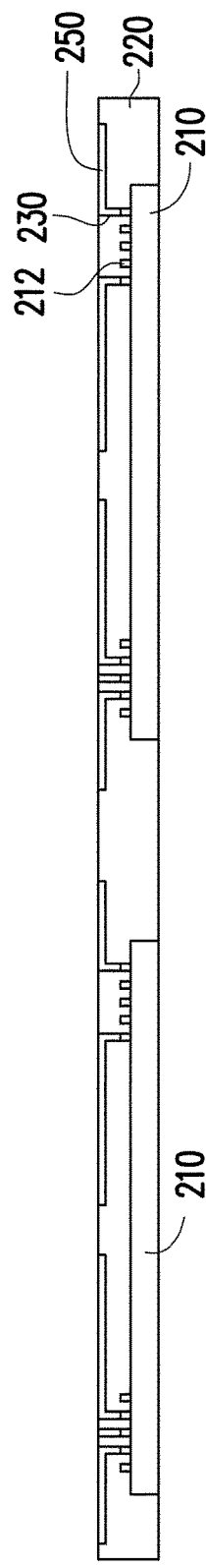

Next, first conductive vias 230 may be formed in a manner of coarsening with laser or plasma, and direct electroplating, which is similar to the manufacturing method of the foregoing conductive vias 130, so that the first conductive vias penetrate through the first insulator 220 and are electrically connected to the electrical contacts 212 as shown in FIG. 20. Afterwards, a first patterned circuit layer 250 is formed in a manner of coarsening with laser, plasma or a mechanical cutting tool, and direct electroplating, which is similar to the manufacturing method of the foregoing patterned circuit layer. The first patterned circuit layer 250 is electrically connected to the conductive vias 230 and the electrical contacts 212.

Figure 21:
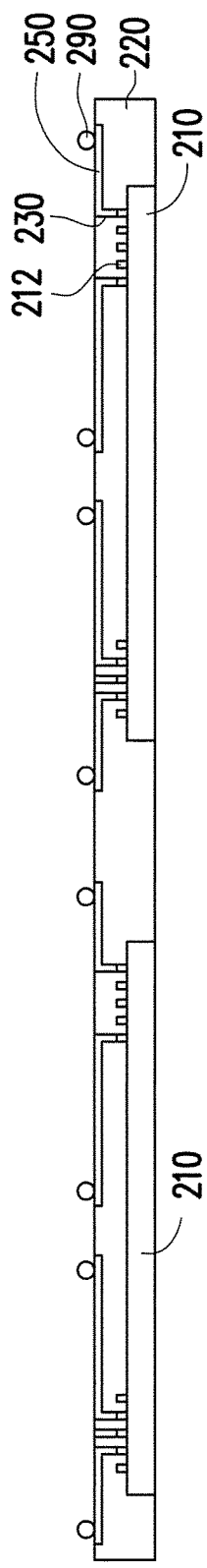

Next, as shown in FIG. 21, a plurality of solder balls 290 may be formed again on a first surface of the first insulator 220 and are electrically connected to the first patterned circuit layer 250. At the time, manufacturing of a package structure 200a of the present embodiment may be roughly completed.

FIG. 22 to FIG. 24 are partial schematic cross-sectional views of a manufacturing method of a package structure according to another embodiment of the present invention. It should be noted herein that the manufacturing method of a package structure of the present embodiment is similar to the foregoing embodiments. Therefore, reference numbers of components and partial content of the foregoing embodiments are still used in the present embodiment. A similar reference number is used to indicate a same or similar component, and a description of content of a same technology is omitted. For a description of an omitted part, refer to the foregoing embodiments, and details are not described in the present embodiment.

Referring to FIGS. 22 and 23, in a manufacturing method of a package structure of the present embodiment, after a first patterned circuit layer 250 is formed, a second insulator 260 shown in FIG. 23 is formed on a first surface of a first insulator 220. Next, third conductive vias 270 are formed in a manner of coarsening with laser or plasma, and direct electroplating, which is similar to manufacturing methods of the foregoing conductive vias, so that the third conductive vias 270 penetrate through the second insulator 260 and are electrically connected to the first patterned circuit layer 250 as shown in FIG. 24.

Afterwards, a third patterned circuit layer 275 is formed in a manner of coarsening with laser, plasma or a mechanical cutting tool, and direct electroplating, which is similar to manufacturing methods of the foregoing patterned circuit layers. The third patterned circuit layer 275 is electrically connected to the third conductive vias 270. Next, as shown in FIG. 24, a plurality of solder balls 290 may be formed on the second insulator 260 and the solder balls 290 are electrically connected to the second patterned circuit layer 275. At the time, manufacturing of a package structure 200b of the present embodiment may be substantially completed.

Based on the above, in the present invention, grooves corresponding to a conductive structure such as a circuit, a pad, and a conductive via, etc., are formed on an insulator by laser, plasma, or mechanical drilling. Surfaces of the grooves formed by laser, plasma, or mechanical drilling are relatively coarse and are therefore suitable for absorbing seed crystal in chemical plating solution. Therefore, according to the manufacturing method of a package structure of the present invention, a chemical plating process is performed on an insulator to form a seed layer in the grooves, and the conductive structure such as the circuit, the pad, and the conductive via filled in the grooves is formed by plating by using the seed layer as the conductive path. In this way, according to the package structure and the manufacturing method of a package structure of the present invention, the conductive structure such as the circuit, the pad, and the conductive via may be formed after direct chemical plating and electroplating is performed on the insulator, so that a manufacturing process of the package structure may be simplified effectively. In addition, according to the present invention, the insulator may be chemically plated and electroplated after a corresponding groove pattern is carved on the insulator by laser, plasma, or mechanical drilling, so that design flexibility of circuit layout may be significantly improved.

Although the present invention is described in embodiments above, the embodiments are not intended to limit the present invention. Any person of ordinary skill in the art may certainly make some modifications and improvements without departing from the spirit and the scope of the present invention, and the protection scope of the present invention is be subject to the protection scope of the claims attached.

What is claimed is:

1. A package structure, comprising:
   a substrate comprising a plurality of through holes;
   a first insulator covering the substrate and filled in the through holes;
   a plurality of first conductive vias, located in the through holes, penetrating through the first insulator filled in the through holes;
   a plurality of pads disposed on an upper surface of the first insulator and a lower surface opposite to the upper surface, and electrically connected to the first conductive vias, wherein a bottom surface of each pad located on the upper surface is lower than the upper surface of the first insulator, and a bottom surface of each pad located on the lower surface is lower than the lower surface of the first insulator; and
   a first patterned circuit layer disposed on the upper surface of the first insulator and connected to the first conductive vias and the pads, wherein a bottom surface of the first patterned circuit layer is lower than the upper surface of the first insulator, wherein a material of the first insulator does not comprise a metal oxide complex suitable for being activated by laser, plasma, or a mechanical cutting tool, so as to be capable of performing metallization coating thereon.

2. The package structure according to claim 1, wherein a material of the first insulator comprises epoxide (epoxy), diallyl phthalate (DAP), benzocyclobutene (BCB), polyester, acrylic ester, fluorine polymer, polyphenylene oxide, polyimide, phenol formaldehyde resin, polysulfone, silicon polymer, BT modified epoxy resin (Bismaleimide-Triazine modified epoxy resin), isocyanate polyester, polyethylene, polycarbonate resin, acrylonitrile-butadiene-styrene copolymer, polyethylene terephthalate (PET), polybutylene terephthalate (PBT), liquid crystal polyester (liquid crystal polyester, LCP), polyamide (PA), nylon 6, polyoxymethylene (POM), polyphenylene sulfide (PPS), polycarbonate (polycarbonate, PC), polymethacrylate (polymethacrylate, PMMA), ABS resin (Acrylonitrile Butadiene Styrene, ABS) or cyclic olefin copolymer (COC).

3. The package structure according to claim 1, wherein the first insulator at least covers a top surface of the substrate and a bottom surface opposite to the top surface, and each through hole connects the top surface and the bottom surface.

4. The package structure according to claim 1, further comprising at least one first semiconductor device disposed on the upper surface of the first insulator and electrically connected to the first conductive vias.

5. The package structure according to claim 4, wherein the at least one first semiconductor device comprises a plurality of active components and/or a plurality of passive components.

6. The package structure according to claim 4, further comprising a second insulator disposed on the upper surface of the first insulator and that covers the at least one first semiconductor device and the pads.

7. The package structure according to claim 6, wherein a material of the second insulator comprises epoxide (epoxy), diallyl phthalate (DAP), benzocyclobutene (BCB), polyester, acrylic ester, fluorine polymer, polyphenylene oxide, polyimide, phenol formaldehyde resin, polysulfone, silicon polymer, BT modified epoxy resin (Bismaleimide-Triazine modified epoxy resin), isocyanate polyester, polyethylene, polycarbonate resin, acrylonitrile-butadiene-styrene copolymer, polyethylene terephthalate (PET), polybutylene terephthalate (PBT), liquid crystal polyester (liquid crystal polyester, LCP), polyamide (PA), nylon 6, polyoxymethylene (POM), polyphenylene sulfide (PPS), polycarbonate (polycarbonate, PC), polymethacrylate (polymethacrylate, PMMA), ABS resin (Acrylonitrile Butadiene Styrene, ABS) or cyclic olefin copolymer (COC).

8. The package structure according to claim 6, further comprising a plurality of second conductive vias penetrating through the second insulator and connected to the pads.

9. The package structure according to claim 8, further comprising at least one second semiconductor device disposed on the second insulator and electrically connected to the second conductive vias.

10. The package structure according to claim 9, wherein the at least one second semiconductor device comprises a plurality of active components and/or a plurality of passive components.

11. The package structure according to claim 6, further comprising a second patterned circuit layer disposed on an upper surface of the second insulator.

12. The package structure according to claim 11, wherein a bottom surface of the second patterned circuit layer is lower than the upper surface of the second insulator.

13. The package structure according to claim 1, further comprising a plurality of solder balls disposed on the lower surface opposite to the upper surface of the first insulator and electrically connected to the first conductive vias.

14. The package structure according to claim 1, wherein the substrate comprises a lead frame.

15. The package structure according to claim 1, further comprising a bottom surface patterned circuit layer disposed on the lower surface of the first insulator and connected to the first conductive vias and the pads, wherein a bottom surface of the bottom surface patterned circuit layer is lower than the lower surface of the first insulator.

16. A package structure, comprising:
   a substrate comprising a plurality of electrical contacts, a top surface, a bottom surface opposite to the top surface, and a plurality of substrate through holes penetrating through the substrate and electrically connected to the top surface and the bottom surface of the substrate, wherein the electrical contacts are disposed on the top surface;
   a first insulator disposed on the substrate and at least covering the top surface and the bottom surface opposite to the top surface;

a plurality of first conductive vias disposed on the first insulator and electrically connected to the electrical contacts;

a first patterned circuit layer disposed on a first surface of the first insulator and electrically connected to the first conductive vias, wherein a lower surface of the first patterned circuit layer is lower than the first surface of the first insulator;

a plurality of second conductive vias penetrating through the first insulator which covers the bottom surface, wherein the second conductive vias are electrically connected to the substrate through holes; and a second patterned circuit layer disposed on a second surface of the first insulator covering the bottom surface, wherein the second patterned circuit layer is electrically connected to the second conductive vias, and a lower surface of the second patterned circuit layer is lower than the second surface of the first insulator.

17. The package structure according to claim 16, further comprising at least one semiconductor device disposed on the insulator and electrically connected to the first patterned circuit layer and/or the second patterned circuit layer.

18. The package structure according to claim 16, further comprising a plurality of solder balls disposed on the first surface and electrically connected to the first patterned circuit layer.

19. The package structure according to claim 16, wherein the first insulator covers the top surface and a side surface of the substrate.

20. The package structure according to claim 16, further comprising:
a second insulator disposed on the first surface;
a plurality of third conductive vias penetrating through the second insulator, and electrically connected to the first patterned circuit layer; and
a third patterned circuit layer disposed on the second insulator and electrically connected to the third conductive vias, wherein a lower surface of the third patterned circuit layer is lower than an upper surface of the second insulator.

21. The package structure according to claim 20, further comprising:
a plurality of solder balls disposed on the second insulator and electrically connected to the second patterned circuit layer.

* * * * *